United States Patent [19]

Oikawa et al.

[11] Patent Number: 5,021,855
[45] Date of Patent: Jun. 4, 1991

[54] GATE TURN-OFF THYRISTOR

[75] Inventors: Saburo Oikawa; Tsutomu Yatsuo; Yukimasa Satou, all of Hitachi, Japan

[73] Assignee: Hitachi, Ltd., Tokyo, Japan

[21] Appl. No.: 326,455

[22] Filed: Mar. 20, 1989

Related U.S. Application Data

[63] Continuation of Ser. No. 72,052, Jul. 10, 1987, abandoned.

[30] Foreign Application Priority Data

Jul. 14, 1986 [JP] Japan .................... 61-163832

[51] Int. Cl.$^5$ ............................ H01L 29/74
[52] U.S. Cl. ............................ 357/38; 357/39
[58] Field of Search ..................... 357/38, 39

[56] References Cited

U.S. PATENT DOCUMENTS

| 4,086,611 | 4/1978 | Nishizawa et al. | 357/38 |
| 4,171,995 | 10/1979 | Nishizawa et al. | 357/38 |
| 4,198,645 | 4/1980 | Nishizawa et al. | 357/38 |
| 4,231,059 | 10/1980 | Hower et al. | 357/38 |
| 4,581,626 | 4/1986 | Krishna et al. | 357/38 |

FOREIGN PATENT DOCUMENTS

| 0077930 | 5/1983 | European Pat. Off. | 357/38 |
| 0174438 | 3/1986 | European Pat. Off. | 357/38 |
| 0190585 | 8/1986 | European Pat. Off. | 357/38 |
| 57-10971 | 1/1982 | Japan | 357/38 |
| 2125619 | 3/1984 | United Kingdom | 357/38 |

OTHER PUBLICATIONS

". . . GTO . . . ", (authors unknown), EOD-85-55, SPC-85-66, pp. 65-71, Aug. 26, 1985 (Japan).

Primary Examiner—Rolf Hille
Assistant Examiner—Steven Loke
Attorney, Agent, or Firm—Antonelli, Terry, Stout & Kraus

[57] ABSTRACT

A gate turn-off thyristor includes a cathode emitter of n-type, a cathode base of p-type, an anode base of n-type and an anode emitter of p-type. A gate electrode is electrically connected to the p cathode base to enclose and define an elemental gate turn-off thyristor region. A plurality of n cathode emitter regions are arranged in proximity to each other in the elemental gate turn-off thyristor region. A highly-doped buried gate region is provided in the p cathode base with the substantially identical configuration for each n cathode emitter regions.

20 Claims, 3 Drawing Sheets

FIG. IA
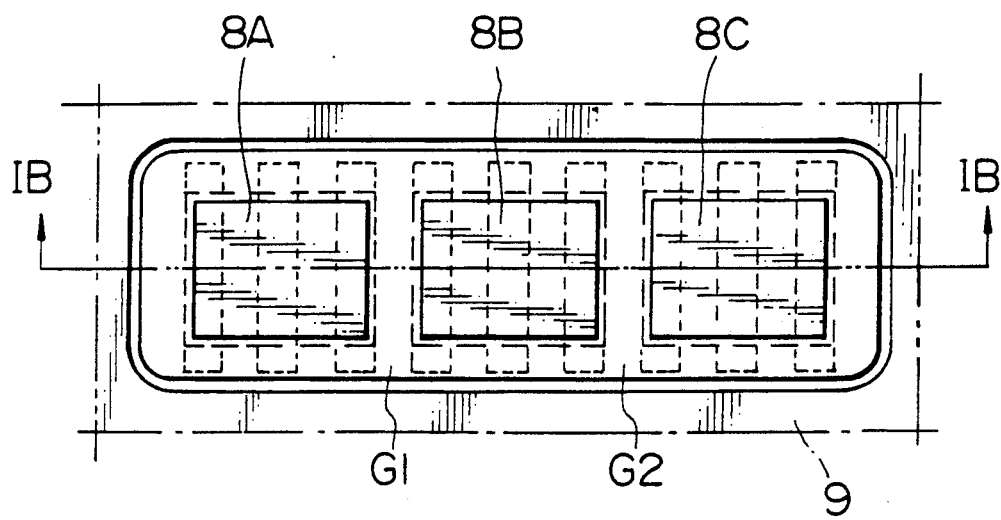
FIG. IB
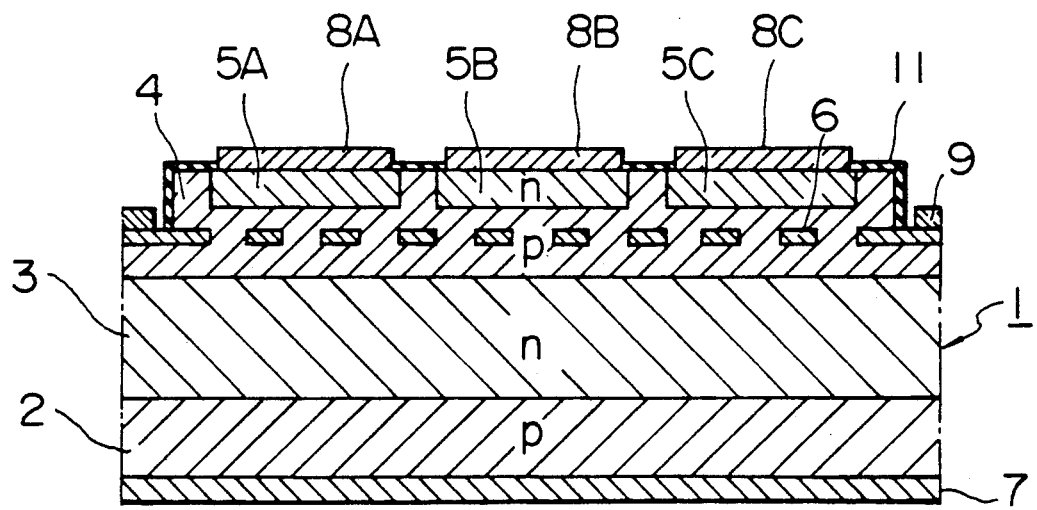

GATE TURN-OFF THYRISTOR

This application is a continuation of application Ser. No. 07/072,052, filed on July 10, 1987.

BACKGROUND OF THE INVENTION

1. Field of the Invention

The present invention relates to a thyristor, and more particularly to a gate turn-off thyristor (GTO) having a multi-emitter.

2. Description of the Related Art

A gate turn-off thyristor is a thyristor which can not only turn on but also turn off a main current flowing between main electrodes (anode and cathode) by a control signal applied to a gate electrode in a state where a forward voltage is being applied between the anode and the cathode. In order to effectively perform the turn-off, it is preferable to narrow the area of the cross section of one current path so that the influence of the control signal can be effectively given to all positions of the current path. Also, in order to avoid a failure of the GTO, it is preferable to provide a plurality of current paths each of which is of an elongated stripe form having a predetermined length. A large current can be obtained by increasing the number of the stripes.

To show the general techniques concerning the gate turn-off thyristor, there are cited T. Yatsuo et al; IEEE Trans. ED, Vol. ED-31, No. 12, December 1984, pp. 1681–86, and U.S. Pat. No. 4,626,888 to T. Nagano et al issued Dec. 2, 1986 (filed Nov. 10, 1983, priority claimed Nov. 10, 1982), which are incorporated herein by reference.

In a typical GTO, a multiplicity of cathode emitters each of which is formed in the shape of elongated stripe and wherein each is enclosed by a gate electrode are arranged in a GTO pellet and each cathode emitter acts as an elemental GTO. A surface of the cathode emitter is metalized to provide a cathode (or emitter) electrode. An electrode plate is brought on the surfaces of the cathode electrodes of the pellet into pressure contact therewith so that all the elemental GTO's operate in a parallel manner.

However, in a large-current GTO using a large-diameter pellet, it is difficult to favorably form all of the cathode emitter regions. In order to allow the manufacture of large-diameter GTO's at a relatively high yield, an elemental GTO having a bad cathode is checked and eliminated from the use leaving only good elemental GTO's. For example, see U.S. Pat. No. 4,341,011 issued to Okano et al on Jul. 27, 1982, which is hereby incorporated by reference.

On the other hand, a heat dissipation from the GTO is affected by bringing a heat sink member such as radiator fin into pressure contact with the electrode plate. In order to maintain the thermal resistance of the heat sink member low, it is required to apply a pressure not smaller than a predetermined value to a surface of the electrode plate having a fixed area. At the pellet surface, this force equal to (area)×(pressure) is mainly carried by a surface of the cathode (emitter) electrode. Therefore, it is preferable to make the occupation ratio of the cathode (emitter) electrode surface area to the pellet surface area as large as possible.

If the area of a surface portion of a cathode base exposed to the principal surface of the pellet and the area of a gate electrode provided on the surface of the cathode base increase, the area of a cathode emitter region and the area of the cathode electrode are correspondingly decreased so that the electrode material is liable to be crushed when a pressure is applied. Moreover, if the number of elemental GTO's eliminated as the result of a test is large, the force applied to the remaining elemental GTO's is necessarily further increased. Accordingly, the electrode material is further liable to be pressed thin and crushed. The crushed cathode electrode may extend to and electrically become in contact with the gate electrode or the surface portion of the cathode base region, thereby causing a short circuit.

In many cases, a level difference is provided on the surface of a pellet so that a gate electrode is provided at the lower surface level. This provision is effective for prevention of a short-circuit trouble. However, the division of a cathode emitter into many elemental regions results in the expansion of the length of a margin providing the difference level. A strain is liable to generate at the marginal portion, thereby causing mechanical damage such as breakage. Therefore, the expansion of the length of the level-difference margin is liable to lower the manufacture yield.

If no level difference is provided, on the other hand, a cathode emitter electrode, a gate electrode and a cathode base region assume a co-planar arrangement. In that case, if the cathode and gate electrodes contact with each other due to the crush, etc. of the cathode electrode when the pressure contact is made, there results in a short-circuit trouble. Even in the case where no short circuiting has resulted between the electrodes, short-circuit trouble is encountered if a pin-hole is present in a passivation film on the cathode base and the crushed cathode electrode extends into the pin-hole.

A buried gate structure has been proposed for static induction (SI) thyristors, gate turn-off thyristors, etc. (see, for example, U.S. Pat. No. 4,086,611, U.S. Pat. No. 4,171,995, U.S. Pat. No. 4,198,645 and JP-A-57-10971, which are hereby incorporated by reference). A $p^+$ buried gate region of high impurity concentration is formed in a $p^-$ cathode base region of low impurity concentration, thereby permitting decrease of a distance between a current path and a region to be controlled.

SUMMARY OF THE INVENTION

An object of the present invention is to provide a highly-reliable and low-cost GTO by a device structure with a large cathode emitter electrode area without deteriorating the current turn-off capability of the GTO.

The present inventors have analyzed the conventional GTO's and have studied and determined what is necessary for improving the current turn-off capability of the GTO and at the same time maintaining its reliability over a long time. The studies include the following:

(a) In the case where an electrode plate is brought into pressure contact with the surface of a GTO pellet, there is a possibility that if a load per unit area of the surface of a cathode electrode contacting with the electrode plate is too large, the cathode electrode may be crushed during its use over a long time and may contact with a cathode base region through a pin-hole in an oxide film or in contact with a gate electrode, thereby resulting in short-circuitry of the cathode and the gate. In order to prevent such trouble, it is effective to enlarge the area of the contact surface of the cathode electrode with the electrode plate. However, in order to improve the yield, it is necessary to fabricate a multiplicity of elemental GTO's and to eliminate/elemental GTO's identified as being defective as a result of a test, thereby constituting a GTO device with only good elemental GTO's.

(b) In the case where a structure is employed in which a level difference is provided at the periphery of a cathode emitter junction to enclose the cathode emitter in a raised portion by a gate electrode disposed on the lower level surface, the length of a margin providing the level difference becomes large. The level-difference margin is liable to break and is subjected to the generation of a defect due to any possible fault in a photoetching process. Therefore, inconveniences such as the instability of characteristics may result and by all accounts there may result in the lowering of a manufacture yield. Accordingly, the length of the level-difference margin should not be made too large.

(c) When the number of elemental GTO's to be arranged in one GTO device is made too large, there are problems including the complexity of a package structure associated with the complexity of a pattern required, high cost resulting from the complexity of a test, etc. and the lowering of reliability from the concentrated application of a load to the limited number of good elemental GTO's resulting from the trimming of defective elemental GTO's. Accordingly, the number of elemental GTO's should not be made too great.

Based on these studies, the present inventors propose a double structure in which an elemental GTO is enclosed by a metal gate electrode and a plurality of cathode emitter regions are formed in the elemental GTO. The cathode emitter regions can be individually tested. No metal gate electrode is provided between the adjacent cathode emitter regions in the elemental GTO.

The areas of a cathode emitter junction and a cathode electrode in the elemental GTO enclosed by the gate electrode of the GTO are made large as compared with the area of an elemental GTO in the conventional GTO, and the cathode emitter junction and the cathode electrode included in each elemental GTO is divided into a plurality of segmental regions while making a width between the segmental regions sufficiently narrow. As a result, it is possible to increase the number of the segmental cathode regions or the number of the segmental cathode electrodes and to enlarge the area of segmental cathode region or electrode. A highly-doped buried layer is partially formed in a cathode base layer beneath the cathode emitter layer, thereby effectively controlling each current path. It is preferable to make it a rule to dispose the highly-doped buried gate region below an intermediate region between the segmental cathode regions.

With the above-described construction, it is possible to reduce the wiring area of the gate electrode, thereby increasing the effective area of the cathode electrode. Provided that a force applied from the exterior is determined by the area of a pellet which depends upon the wafer diameter, etc. and a desired thermal resistance, the increase of the cathode electrode area results in the lowering of a pressure per unit area, thereby preventing the crushing of the electrode material and thus improving the reliability of the GTO over a long time.

In the case where a certain segmental cathode emitter junction is identified as being defective as the result of a test, the cathode electrode at that portion is removed or trimmed. Thus, the lowering of a manufacture yield of the device due to a partially insufficient breakdown voltage of the cathode emitter junction can be remarkably improved.

By making the opposing lengths of the gate and cathode electrodes small, a trouble of electrical contact between both the electrodes can be reduced. By making an interval between the adjacent segmental cathode emitter junctions small, the occupation proportion of the cathode electrode area can be made large. To make the area of an exposed portion of a base layer on the cathode side between the adjacent junctions small results in reduction of the percentage of occurrence of pin-holes in a surface coating or passivation material at that exposed portion.

BRIEF DESCRIPTION OF THE DRAWINGS

FIG. 1A is a plan view of a cathode surface of an elemental GTO according to one embodiment of the present invention;

FIG. 1B is a vertical cross section taken along line IB—IB in FIG. 1A;

DESCRIPTION OF THE PREFERRED EMBODIMENTS

Figure 2A:
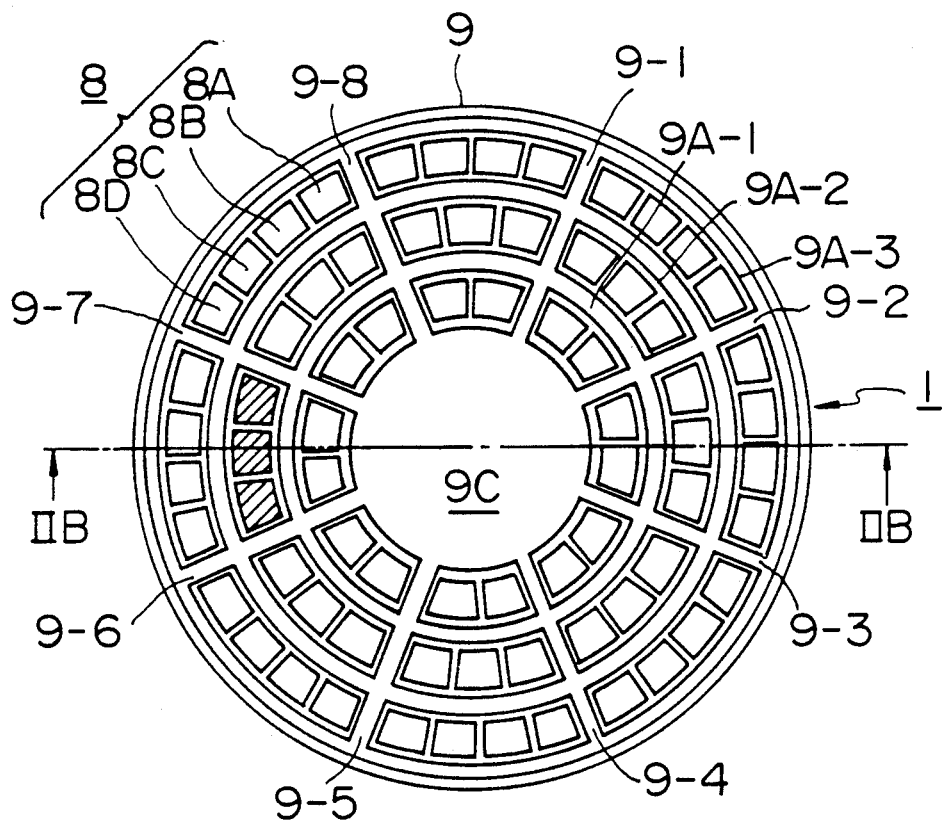
FIG. 2A is a plan view showing an example of the cathode pattern of an actual GTO in which elemental GTO's shown in FIGS. 1A and 1B are arranged.

An embodiment of the present invention will now be explained by virtue of FIGS. 1A, 1B, 2A and 2B.

FIGS. 1A and 1B show a part of the surface pattern of and a part of the cross section of an elemental GTO portion in a GTO which employs the present invention. A semiconductor body or substrate 1 includes an emitter layer 2 of p-type on the anode side (hereinafter referred to as anode emitter layer), a base layer 3 of n-type on the anode side (hereinafter referred to as n base layer), a base layer 4 of p-type on the cathode side (hereinafter referred to as p base layer) and an emitter layer of n-type on the cathode side (hereinafter referred to as cathode emitter layer).

The semiconductor body 1 is made of, for example, a silicon wafer of 500 $\mu$m thickness. The n base layer 3 has, for example, an impurity concentration on the order of $10^{13}$ to $10^{15}$ cm$^{-3}$ and a thickness of 200 to 300 $\mu$m. The impurity concentration of the p base layer 4 is on the order of $10^{15}$ to $10^{17}$ cm$^{-3}$, the surface impurity concentration of the anode emitter layer 2 is not lower than $10^{18}$ cm$^{-3}$, and the surface impurity concentration of the cathode emitter layer 5 is on the order of $10^{20}$ to $10^{21}$ cm$^{-3}$. The thickness of the n base layer 3 is one of main factors which determine a breakdown voltage.

The cathode emitter layer 5 is divided into three segmental regions inclusive of first to third emitter regions 5A to 5C in the p base layer 4. Each segmental emitter region is of a rectangular shape and the adjacent rectangles are arranged substantially in parallel with each other. Each rectangle has dimensions of a vertical length of about 3 mm and a horizontal length of about 3 to 9 mm in FIG. 1A. These dimensions may be altered corresponding to the shape of a buried gate region which will be described in below. The dimensions of the respective segmental emitter regions in the elemental GTO may be individually changed but it is preferable to make at least their vertical lengths common to each other.

A highly-doped buried gate region 6 is partially disposed in the p base layer 4 beneath the cathode emitter layer 5. The highly doped region 6 functions as a substantial gate electrode which controls the potential of the p base layer. It is preferable to make the pattern of the buried gate region common to all the emitter regions 5A, 5B and 5C, and it is preferable to make it a rule to arrange the buried gate region at locations G1 and G2 between the adjacent emitter regions 8A, 8B and 8C. FIGS. 1A and 1B illustrate the buried gate region having a pattern of parallel-grid shape, but the pattern shape is not limited to the illustration. For example, the pattern may be of crossed-grid shape, mesh shape, multi-ring shape or the like. The shape of the emitter region, too, is not limited to the illustrated rectangular form. What is necessary is that a plurality of emitter regions are arranged in proximity to each other within the elemental GTO and the buried gate region disposed below the emitter regions is electrically connected to an external gate electrode in low resistance contact therewith to control the potential of the p base region effectively. The buried region may be formed by doping a surface portion of the lower part of the p layer 4 with a p-type impurity of high concentration through diffusion, ion implantation or the like and thereafter epitaxially growing the upper part of the p layer 4. Then, the surface of p layer 4 is selectively doped with an n-type impurity to form the emitter regions 5A, 5B and 5C. The upper surface of the buried layer 6 is located at a depth of, for example, about 30 μm from the pellet surface. The impurity concentration of the buried layer 6 is selected to be higher than that of the p base layer by one or more orders and is, for example, on the order of $10^{18}$ cm$^{-3}$. At the periphery of the elemental GTO, the upper part of the p base layer 4 is etched off to expose the buried gate region 6. As a result, the elemental GTO is formed at a mesa portion, as is shown in FIGS. 1A and 1B. A surface of the semiconductor body excepting window regions for providing electrodes is covered with a passivation film made of, for example, oxide or polyimide.

An anode electrode 7, cathode electrodes 8A to 8C, and a gate electrode 9 are formed by evaporation or the like on the surfaces of the anode emitter layer 2, the cathode emitter layers 5A to 5C, and the p base layer 4, respectively, in ohmic and low resistance contact therewith. A material used for these electrodes may be aluminum (Al) or aluminum-silicon (Al/Si) alloy. Though the anode electrode 7 is shown to contact with only the anode emitter layer 2, a so-called shorted-anode structure may be employed in which the n base region 3 is exposed to the lower surface of the semiconductor body 1 and electrically connected to the anode electrode 7.

The cathode electrode is divided into the segments 8A, 8B and 8C corresponding to the segmental cathode emitter regions 5A, 5B and 5C. By trimming any one of the cathode electrode segments, the corresponding cathode emitter region can be eliminated.

A structural feature of the invention seen in the present embodiment is that the cathode emitter layer within the elemental GTO enclosed by the gate electrode 9 is divided into the plurality of segmental emitter regions 5A, 5B and 5C and the ohmic electrodes 8A, 8B and 8C are made in contact with the segmental emitter regions 5A, 5B and 5C, respectively. Since no gate electrode exists between the emitter regions 5A, 5B and 5C within the elemental GTO, the segmental emitter regions can be arranged in proximity to each other. Since the buried gate region 6 is provided below the segmental emitter regions, all the currents can be effectively controlled. In order to effectively apply a control signal to the buried gate region 6, the buried region 6 is exposed at a peripheral portion of the elemental GTO and the gate electrode 9 is disposed on the exposed portion of the buried gate region 6. Namely, one mesa which the gate electrode 9 encloses forms the elemental GTO and the plurality of cathode emitter regions are arranged in proximity to each other in the elemental GTO through no gate electrode.

Figure 2B:
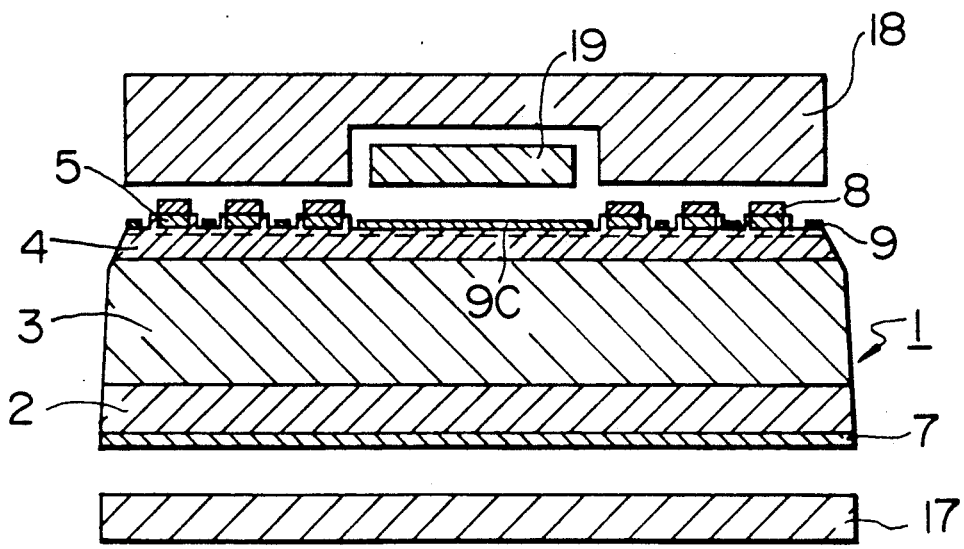
FIG. 2B is a vertical cross section taken along line IIB—IIB in FIG. 2A.

FIGS. 2A and 2B show a concrete example in which a plurality of elemental GTO's as shown in FIGS. 1A and 1B are arranged in a pellet of an actual large-current GTO. In FIGS. 2A and 2B, the same or similar reference numerals as or to those in FIGS. 1A and 1B represent the same or similar components.

The cathode emitter layer 5 is arranged in a concentric- and triple-ring form in one semiconductor body or pellet 1. The gate electrode 9 includes a central portion 9C, eight arms 9-1, - - - , 9-8 extending in radial direction, and concentric annular portions 9A-1, 9A-2 and 9A-3. A section enclosed by two adjacent arms and two adjacent annular portions (inclusive of the central portion) of the gate electrode 9 form an elemental GTO 8. Each ring of the cathode emitter layer 5 is divided into eight parts by the arms 9-1, - - - , 9-8 of the gate electrode 9 so as to provide eight elemental GTO's 8 enclosed by the gate electrode 9. Each elemental GTO enclosed by the gate electrode 9 includes, for example, four emitter regions 8A to 8D. Some of the elemental GTO's may assume a structure in which one emitter region is included in one elemental GTO.

Though FIGS. 2B shows a two-level bevel structure, another structure may be employed in compliance with the breakdown voltage requirements, etc.

In the present embodiment, a gate electrode plate 19 for supplying to each elemental GTO an external signal which turns the GTO on or off, is brought into low resistance contact (or pressure contact) with the central circular portion 9C of the gate electrode 9 at the center portion of the pellet.

In the GTO having such a structure, two electrode plates 17 and 18 connecting with external terminals are brought into pressure contact with the anode and cathode electrodes 7 and 8, respectively, so that all of a plurality of elemental GTO segments and a plurality of segmental cathode emitter regions in each elemental GTO operate in a parallel manner. The connection to the external terminals may be made by soldering, welding or the like other than pressure contact. For such structures, one can refer to U.S. Pat. No. 4,500,903, U.S. Pat. No. 4,542,398, U.S. Pat. No. 3,239,728 and U.S. Pat. No. 4,450,467, which are incorporated by reference. The rating of the GTO thus obtained has, for example, the breakdown voltage of 4500 V and the maximum turn-off current of 3500 A.

With the GTO described above, the following effects can be attained.

Namely, since the cathode emitter layer 5 in the elemental GTO enclosed by the gate electrode 9 is divided into a plurality of regions, the occupation ratio of the area of the gate electrode 9 on the entire semiconductor body 1 can be made small as compared with the case where a single cathode emitter region is included in an elemental GTO, and hence the occupation ratio of the area of the cathode electrode 8 can be correspondingly increased. As a result, a pressure per unit area of the cathode electrode when electrode plates are brought from the opposite surface sides of the semiconductor body into pressure contact therewith, can be reduced, thereby preventing the crushing of the electrode material (made of, for example, aluminum). Accordingly, the reliability and the usable life of the GTO can be significantly improved.

The division of the cathode emitter layer in the elemental GTO into a plurality of regions also permits the elimination (or trimming) of only a defective cathode portion.

Moreover, the division of the cathode emitter layer in the elemental GTO reduces the cathode electrode area per one defect. Therefore, the reduction of a working area in the semiconductor body resulting from the trimming of the defective cathode emitter layer can be minimized. Namely, a large-current GTO can be manufactured at a high yield while maintaining a high performance.

Figure 3:
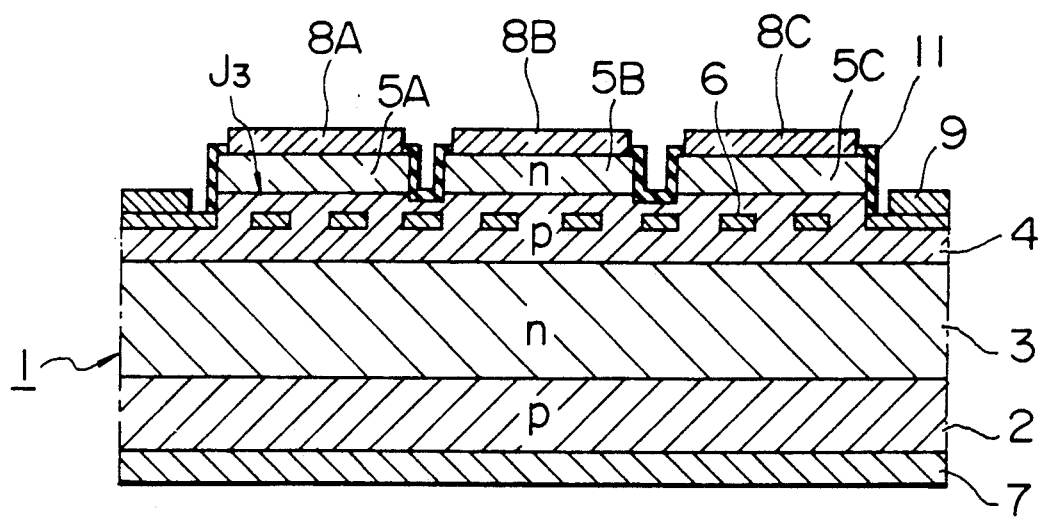
FIGS. 3 and 4 are vertical cross sections of respective elemental GTO's according to other embodiments of the present invention.

FIG. 3 shows in cross section another embodiment of the present invention. In FIG. 3, the same reference numerals as those in FIG. 1B represent similar components. The embodiment of FIG. 3 is different from the embodiment of FIG. 1B in that an emitter junction J3 forming the cathode emitter layer 5 is co-planar and the end thereof is exposed to a side face of a groove in the semiconductor body surface. In other words, the emitter junction of so-called planar structure is employed in FIG. 1B while the emitter junction of so-called mesa structure is employed in FIG. 3. Even in the case where such a mesa junction is used, the cathode emitter layer 5 in the elemental GTO enclosed by the gate electrode 9 can be divided into a plurality of regions. In that case, a short-circuit trouble is hard to occur even if pin-holes are present in the passivation film and the cathode electrode is crushed. However, it is preferable to employ the construction shown in FIG. 1B when breakages are liable to take place at locations where the level difference exists.

Figure 4:
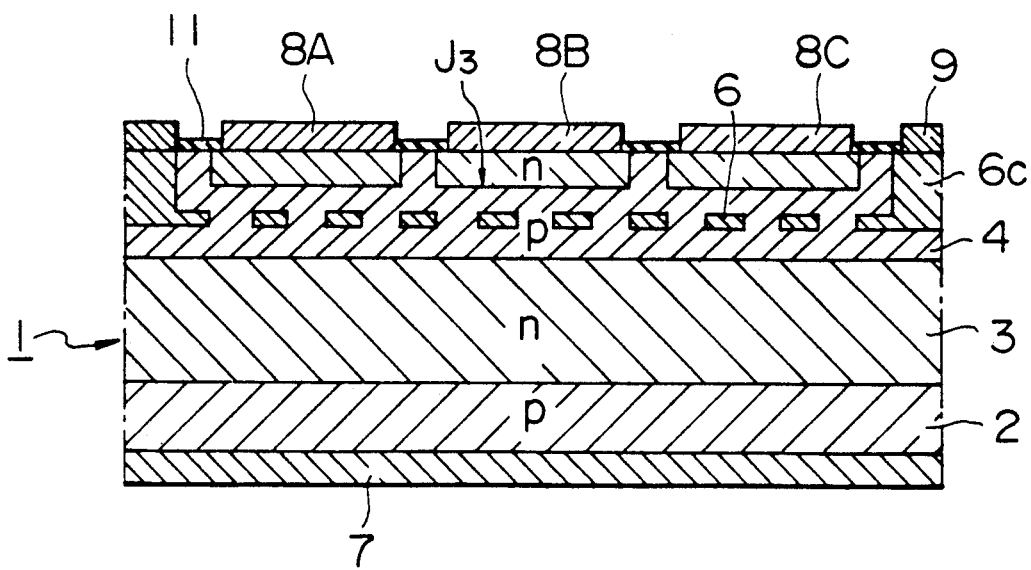

FIG. 4 shows in cross section a further embodiment of the present invention. In FIG. 4, the same reference numerals as those in FIG. 1B represent similar components. The embodiment of FIG. 4 is different from the embodiment of FIG. 1B in a position at which the gate electrode 9 makes a low resistance contact with the p base layer. Namely, in the case of the embodiment of FIG. 1B the low resistance contact portion is formed at a position sunken from the principal surface of the semiconductor body 1 by one level while in the case of the embodiment of FIG. 4 it is formed on the principal surface at the same level as the cathode electrode 8. Therefore, the embodiment of FIG. 4 has an advantage that an etching-down process for forming a groove for providing the gate electrode contact is not necessary. But, it is necessary to form a deep highly-doped region 6C which reaches the buried region 6.

The embodiments of FIGS. 1B, 3 and 4 are common to each other in that one buried region bar is provided below an intermediate portion between the adjacent segmental emitter regions to substantially equalize the operations of the individual segmental emitter regions.

It is apparent from the foregoing that a highly-reliable large-current GTO can be realized by enlarging a conducting area in the semiconductor body of the power GTO to reduce a pressure load per unit area imposed onto the cathode electrode upon application of pressure from opposite surface sides of the semiconductor body, thereby solving a technical task which results from the possible crushing of the electrode material in the conventional GTO and includes successive inconveniences of short circuit between gate and cathode, current turn-off fault and device breakage.

Though the size or area of each elemental GTO enclosed by the gate electrode is made large, the division of the cathode emitter and the cathode electrode in the elemental GTO into a plurality of segmental parts permits the trimming of a defective cathode emitter layer in units of the segmental parts. Accordingly, the reduction of an effective working area of the semiconductor body can be minimized, thereby providing a high manufacture yield.

We claim:

1. A semiconductor gate turn-off thyristor comprising:
    a semiconductor body including a four-layer structure of an anode emitter layer, an anode base layer, a cathode base layer and a cathode emitter layer which are laminated successively in that order to form pn junctions between every adjacent two layers, and highly-doped buried means for forming a gage in said cathode base layer, said cathode emitter layer being comprised of a plurality of independent groups each one including at least two spaced-apart segmental regions;
    anode electrode means for making ohmic contact with said anode emitter layer;
    cathode electrode means including a plurality of cathode electrodes each formed on and being in ohmic contact with said segmental regions, respectively; and
    gate electrode means formed so as to be in ohmic contact with said cathode base layer and including an internal arrangement of respective single loop-like gate electrode portions, each single loop-like gate electrode portion being formed and dimensioned to surround only an outer periphery of a corresponding one of said plurality of segmental region groups.

2. A semiconductor gate turn-off thyristor according to claim 1 wherein said four-layer structure is divided into a plurality of individual portions each including one of said segmental region groups of said cathode emitter layer to form therein an elemental gate turn-off thyristor in cooperation with a corresponding single loop-like gate electrode portion surrounding said one segmental region group together with said anode electrode means and the cathode electrodes which are in ohmic contact with said one segmental region group.

3. A semiconductor gate turn-off thyristor according to claim 2, wherein said highly-doped buried gate means is structurally disposed in said semiconductor body cathode base layer such that in each elemental gate turn-off thyristor formed therein there is included a portion of said highly-doped buried gate means which is configured to provide a common pattern of highly-doped buried regions with respect to all the segmental regions included in a corresponding elemental gate turn-off thyristor.

4. A semiconductor gate turn-off thyristor according to claim 2, wherein said plurality of individual portions of the four-layer structure are arranged to have a multi-ring form in said semiconductor body.

5. A semiconductor gate turn-off thyristor according to claim 2, wherein a portion of said highly-doped buried gate means serving to form each of said elemental gate turn-off thyristors is made in the form of a parallel-grid shape.

6. A semiconductor gate turn-off thyristor according to claim 1, wherein said gate electrode means is in ohmic contact with said highly-doped buried gate means.

7. A semiconductor gate turn-off thyristor according to claim 1, wherein said spaced-apart segmental regions of each group in said cathode emitter layer are of rectangular shape and are arranged within each of said segmental region groups to be substantially in parallel with each other.

8. A semiconductor gate turn-off thyristor according to claim 6, wherein said four-layer structure is divided into a plurality of individual portions each individual portion having formed therein a respective elemental gate turn-off thyristor including a segmental region group of at least two individual and spaced-apart cathode emitter segmental regions, a plurality of highly-doped buried gate regions associated therewith laterally disposed at regular intervals and parallelly aligned forming a buried gate layer beneath said cathode emitter spaced-apart segmental regions with respect to each elemental gate turn-off thyristor and in cooperation with a corresponding single loop-like gate electrode portion which surrounds only the outer periphery of said segmental region group together with said anode electrode and said cathode electrodes which are in respective ohmic contact with said anode emitter layer and said cathode emitter layer.

9. A semiconductor gate turn-off thyristor according to claim 8, wherein said plurality of highly-doped buried gate regions in each of said portions are configured as a common pattern of highly-doped buried regions with respect to all the segmental regions associated therewith in the corresponding portion.

10. A semiconductor gate turn-off thyristor according to claim 9, wherein said highly-doped buried gate layer is made in the form of a parallel-grid shape in each elemental gate turn-off thyristor.

11. A semiconductor gate turn-off thyristor according to claim 8, wherein said plurality of elemental gate turn-off thyristors are symmetrically arranged in a concentric multi-ring layout configuration in said semiconductor body.

12. A semiconductor gate turn-off thyristor according to claim 8, wherein said spaced-apart segmental cathode emitter regions in each elemental gate turn-off thyristor are of rectangular shape and are arranged within each of said segmental region groups to be substantially in parallel with each other.

13. A semiconductor gate turn-off thyristor comprising:
a semiconductor body including a four-layer structure of an anode emitter layer, an anode base layer, a cathode base layer and a cathode emitter layer which are laminated successively in that order to form pn junctions between every adjacent two layers, and highly-doped buried gate regions formed in said cathode base layer, said cathode emitter layer being comprised of a plurality of independent groups each group including at least two spaced-apart segmental regions and wherein each group is associated with a distinct elemental gate turn-off thyristor;
an anode electrode in ohmic contact with said anode emitter layer;
cathode electrode including a plurality of cathode electrode segments each formed on and being in ohmic contact with respective ones of said segmental regions; and
a gate electrode formed in ohmic contact with said cathode base layer and including respective single loop-like gate electrode portions, each single loop-like gate electrode portion being formed and dimensioned to surround only an outer periphery of a corresponding one of said plurality of segmental region groups.

14. A semiconductor gate turn-off thyristor according to claim 13, wherein said four-layer structure is divided into a plurality of individual portions each individual portion having formed therein a respective elemental gate turn-off thyristor including a segmental region group of at least two individual cathode emitter segmental regions, a plurality of highly-doped buried gate regions associated therewith laterally disposed at regular intervals and parallelly aligned forming a buried gate layer beneath said cathode emitter spaced-apart segmental regions with respect to each elemental turn-off thyristor and in cooperation with a corresponding single loop-like gate electrode portion which surrounds only the outer periphery of said segmental region group together with said anode electrode and said cathode electrodes which are in respective ohmic contact with said anode emitter layer and said cathode emitter segments.

15. A semiconductor gate turn-off thyristor according to claim 14, wherein said plurality of highly-doped buried gate regions in each of said portions are configured as a common pattern of highly-doped buried regions with respect to all the segmental regions associated therewith in the corresponding portion.

16. A semiconductor gate turn-off thyristor according to claim 15, wherein said buried gate layer with respect to each individual portion of said four-layer structure is in ohmic contact with a respective single loop-like gate electrode portion, and wherein said single loop-like gate electrode portions are integrally arranged to include a central portion and a plurality of arms extending radially from said central portion based on an arrangement of elemental gate turn-off thyristors in the form of a concentrically arranged multi-ring layout configured structure.

17. A semiconductor gate turn-off thyristor comprising:
a semiconductor body including a four-layer structure of an anode emitter layer, an anode base layer, a cathode base layer and a cathode emitter layer laminated successively in that order to form pn junctions between every adjacent two layers, and highly-doped buried gate regions formed in said cathode base layer, said cathode emitter layer is comprised of a plurality of independent groups each one including at least two spaced-apart segmental regions, said four-layer structure being divided into a plurality of individual portions each having formed therein a respective elemental gate turn-off thyristor associated with an individual cathode emitter group of said at least two spaced-apart segmental regions, a plurality of highly-doped buried gate regions configured as a common pattern of highly-doped buried regions with respect to all the segmental regions associated therewith laterally disposed at regular intervals and parallelly aligned forming a buried gate layer beneath said cathode emitter group of segmental regions associated with an elemental gate turn-off thyristor;

an anode electrode in ohmic contact with said anode emitter layer;

a cathode electrode including a plurality of cathode electrode segments each formed on and being in ohmic contact with respective ones of said segmental regions;

a gate electrode formed in ohmic contact with said cathode base layer and including a plurality of loop-like gate electrode portions each one formed to surround a respective one of said independent cathode emitter groups of at least two spaced-apart segmental regions;

wherein said buried gate layer associated with each individual portion of said four-layer structure is in ohmic contact with a respective one of said plurality of loop-like gate electrode portions, said loop-like gate electrode portions are integrally arranged to include a central portion and a plurality of arms extending radially from said central portion based on a multi-ring layout configured structure having a concentric arrangement of a plurality of elemental gate turn-off thyristors; and wherein said elemental gate turn-off thyristors of said four-layer structure increase in the number of cathode emitter layer segmental regions therein as their radial distance from said central portion increases, and wherein each elemental gate turn-off thyristor is disposed in an area of said layout structure defined by the boundaries between a pair of concentrically arranged rings and the distance between respective radial arms.

18. A semiconductor gate turn-off thyristor according to claim 17, wherein said spaced-apart segmental cathode emitter regions in each elemental gate turn-off thyristor are of rectangular shape and are arranged within each of said segmental region groups to be substantially in parallel with each other.

19. A semiconductor gate turn-off thyristor comprising:

a semiconductor body including a four-layer structure of an anode emitter layer, an anode base layer, a cathode base layer and a cathode emitter layer laminated successively in that order to form pn junctions between every adjacent two layers, and highly-doped buried gate regions formed in said cathode base layer, said cathode emitter layer is comprised of a plurality of independent groups each one including at least two spaced-apart segmental regions, said four-layer structure being divided into a plurality of individual portions each having formed therein a respective elemental gate turn-off thyristor associated with an individual cathode emitter group of at least two spaced-apart segmental regions, a plurality of highly-doped buried gate regions configured as a common pattern of highly-doped buried regions with respect to all the segmental regions associated therewith laterally disposed at regular intervals and parallelly aligned forming a buried gate layer beneath said cathode emitter group of segmental regions associated with an elemental gate turn-off thyristor;

an anode electrode in ohmic contact with said anode emitter layer;

a cathode electrode including a plurality of cathode electrode segments each formed on and being in ohmic contact with respective ones of said segmental regions;

a gate electrode formed in ohmic contact with said cathode base layer and including a plurality of loop-like gate electrode portions each one formed to surround a respective one of said independent cathode emitter groups of at least two spaced-apart segmental regions;

wherein said buried gate layer associated with each individual portion of said four-layer structure is in ohmic contact with a respective one of said plurality of loop-like gate electrode portions, said loop-like gate electrode portions are integrally arranged to include a central portion and a plurality of arms extending radially from said central portion based on a multi-ring layout configured structure having a concentric arrangement of a plurality of elemental gate turn-off thyristors.

20. A semiconductor gate turn-off thyristor according to claim 19, wherein said spaced-apart segmental cathode emitter regions in each elemental gate turn-off thyristor are of a rectangular shape and are arranged within each of said segmental region groups to be substantially in parallel with each other.

* * * * *